(12) United States Patent
Yoshida

(10) Patent No.: US 7,549,346 B2
(45) Date of Patent: Jun. 23, 2009

(54) FLOWMETER ELEMENT, MASS FLOWMETER AND MASS FLOW MEASUREMENT SYSTEM

(75) Inventor: Takahiko Yoshida, Okazaki (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 11/882,138

(22) Filed: Jul. 31, 2007

(65) Prior Publication Data

US 2008/0066557 A1   Mar. 20, 2008

(30) Foreign Application Priority Data

Sep. 20, 2006  (JP)  ............................. 2006-254717

(51) Int. Cl.
    *G01F 1/66*   (2006.01)
(52) U.S. Cl. .................................................. 73/861.28
(58) Field of Classification Search .................. None
    See application file for complete search history.

(56) References Cited

U.S. PATENT DOCUMENTS

| 4,384,491 | A | * | 5/1983 | Brown et al. .............. 73/861.28 |
| 4,527,433 | A | * | 7/1985 | Gutterman ................ 73/861.28 |
| 4,830,219 | A | * | 5/1989 | Siemann ........................ 222/55 |
| 4,860,593 | A | | 8/1989 | De Concini et al. |
| 5,003,822 | A | * | 4/1991 | Joshi ........................ 73/204.23 |
| 5,421,212 | A | | 6/1995 | Mäyränen et al. |
| 6,140,689 | A | | 10/2000 | Scheiter et al. |
| 6,301,973 | B1 | * | 10/2001 | Smith ..................... 73/861.357 |
| 6,320,239 | B1 | | 11/2001 | Eccardt et al. |
| 6,357,299 | B1 | | 3/2002 | Aigner et al. |
| 6,426,582 | B1 | | 7/2002 | Niederer et al. |
| 6,548,937 | B1 | | 4/2003 | Klee et al. |
| 6,796,189 | B1 | * | 9/2004 | Umekage et al. .......... 73/861.27 |
| 6,843,110 | B2 | * | 1/2005 | Deane et al. .............. 73/114.35 |
| 6,941,821 | B2 | * | 9/2005 | Umekage et al. .......... 73/861.27 |
| 7,082,841 | B2 | * | 8/2006 | Umekage et al. .......... 73/861.27 |
| 7,093,502 | B2 | * | 8/2006 | Kupnik et al. ............. 73/861.29 |
| 2003/0068838 | A1 | | 4/2003 | Shie et al. |
| 2005/0000301 | A1 | * | 1/2005 | Umekage et al. .......... 73/861.27 |
| 2006/0080048 | A1 | * | 4/2006 | Kessler et al. .................. 702/35 |
| 2008/0029174 | A1 | * | 2/2008 | Yoshino ....................... 137/828 |
| 2009/0026561 | A1 | | 1/2009 | Reichenbach et al. |

FOREIGN PATENT DOCUMENTS

| DE | 199 28 547 | | 12/1999 |
| DE | 100 62 875 | | 7/2002 |
| JP | 2003-270011 A | | 9/2003 |
| JP | 2004-125804 A | | 4/2004 |
| JP | 2008008706 A | * | 1/2008 |

OTHER PUBLICATIONS

Dewent Abstract translation of JP 2008008706A published on Jan. 17, 2008.*
Office Action dated Dec. 17, 2008 in corresponding German patent application No. 10 2007 042 101.1-52 (and English translation).

* cited by examiner

*Primary Examiner*—Harshad Patel
(74) *Attorney, Agent, or Firm*—Posz Law Group, PLC

(57) ABSTRACT

A flowmeter element is used for measuring a mass flow rate of fluid, and includes a semiconductor board, an ultrasonic unit and a pressure detecting unit. The ultrasonic unit performs at least one of sending ultrasonic wave and receiving ultrasonic wave. The pressure detecting unit detects a pressure of the fluid. The ultrasonic unit and the pressure detecting unit are integrally disposed on the semiconductor board.

22 Claims, 5 Drawing Sheets

FLOWMETER ELEMENT, MASS FLOWMETER AND MASS FLOW MEASUREMENT SYSTEM

CROSS REFERENCE TO RELATED APPLICATION

This application is based on Japanese Patent Application No. 2006-254717 filed on Sep. 20, 2006, the disclosure of which is incorporated herein by reference in its entirety.

BACKGROUND OF THE INVENTION

1. Field of the Invention

The present invention relates to a flowmeter element, a mass flowmeter and a mass flow measurement system, which are used for measuring a mass flow rate of fluid.

2. Description of Related Art

JP-A-2004-125804 discloses an ultrasonic flowmeter for measuring an amount of fluid flowing in a pipe by using ultrasonic wave. The ultrasonic flowmeter includes a first ultrasonic unit and a second ultrasonic unit. The first ultrasonic unit is disposed at an upstream side of a flow measurement part of the pipe, and the second ultrasonic unit is disposed at a downstream side of the flow measurement part of the pipe. The first and second ultrasonic units obliquely oppose to each other across the pipe. The amount of fluid flowing in the pipe is calculated based on a difference in transmission times needed for transmitting ultrasonic wave between the first and second ultrasonic units. That is, ultrasonic wave sent from the first ultrasonic unit takes a first transmission time to be received by the second ultrasonic unit, and ultrasonic wave sent from the second ultrasonic unit takes a second transmission time to be received by the first ultrasonic unit. A velocity of fluid is calculated based on the difference between the first and second transmission times. A volume flow rate of fluid is calculated by multiplying the velocity of fluid by a cross-sectional area of the flow measurement part of the pipe.

However, a mass flow rate of fluid cannot be calculated in the above ultrasonic flowmeter, although the above ultrasonic flowmeter can measure the volume flow rate of fluid. In order to calculate the mass flow rate of fluid, a pressure of fluid has to be measured. If a pressure detecting unit for measuring the pressure of fluid is arranged in the flow measurement part of the pipe, a space for locating the pressure detecting unit is needed in the flow measurement part of the pipe.

SUMMARY OF THE INVENTION

In view of the foregoing and other problems, it is an object of the present invention to provide a flowmeter element, a mass flowmeter and a mass flow measurement system, which are capable of measuring a mass flow rate of fluid.

According to a first example of the present invention, a flowmeter element is used for measuring a mass flow rate of fluid, and includes a semiconductor board, an ultrasonic unit and a pressure detecting unit. The ultrasonic unit performs at least one of sending ultrasonic wave and receiving ultrasonic wave. The pressure detecting unit detects a pressure of the fluid. The ultrasonic unit and the pressure detecting unit are integrally disposed on the semiconductor board.

According to a second example of the present invention, a mass flowmeter includes a flowmeter element integrally including an ultrasonic unit and a pressure detecting unit, a flow measurement part, a volume flow rate calculator and a mass flow rate calculator. Fluid flows in the flow measurement part, and a pair of the flowmeter elements are disposed at an upstream side of the fluid and a downstream side of the fluid to oppose to each other. The volume flow rate calculator calculates a transmission time for transmitting ultrasonic wave between the flowmeter elements, and calculates a volume flow rate of the fluid based on the calculated transmission time. The mass flow rate calculator calculates a mass flow rate of the fluid based on the calculated volume flow rate and a pressure value of the fluid in the flow measurement part detected by the pressure detecting unit.

According to a third example of the present invention, a mass flow measurement system includes a mass flowmeter and a power device for supplying electricity to activate the mass flowmeter. A diagnosis element of the mass flowmeter performs a diagnosis when the power device supplies electricity to the mass flowmeter.

Accordingly, the mass flow rate of fluid can be measured.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF PREFERRED EMBODIMENT

Figure 1:
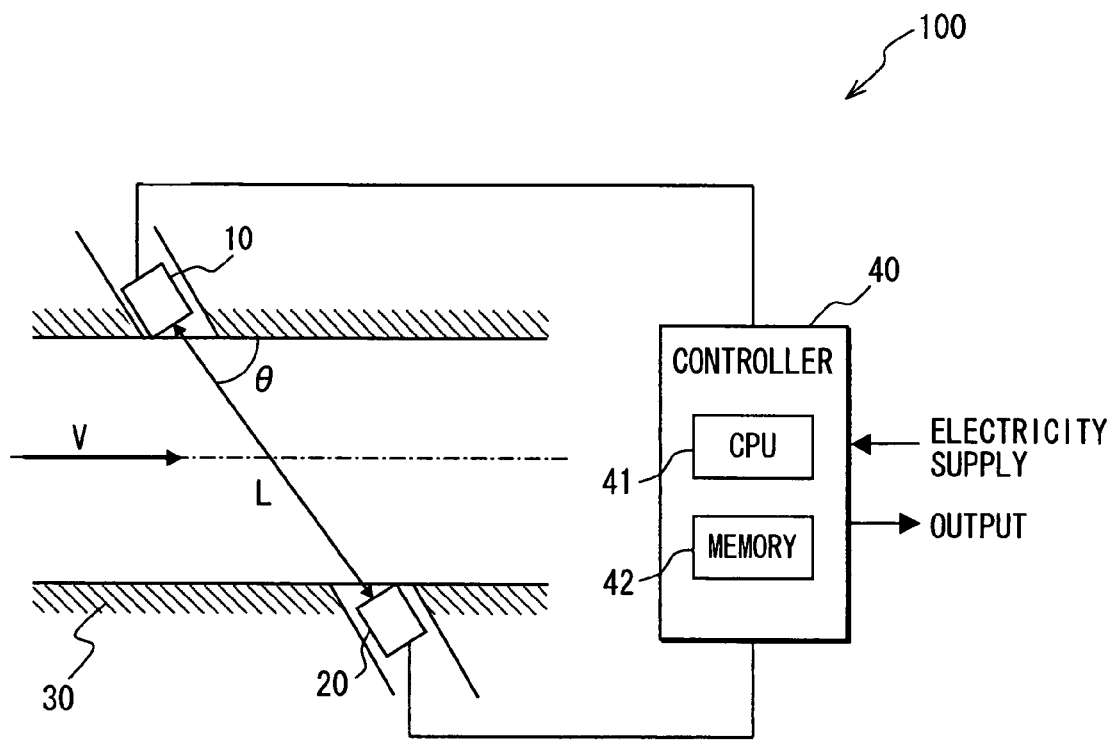
FIG. 1 is a schematic diagram showing a mass flow measurement system according to an embodiment of the present invention.

A mass flow measurement system 100 shown in FIG. 1 is used for controlling an engine in an embodiment. Specifically, the mass flow measurement system 100 is used for measuring a mass flow rate of air taken into a combustion chamber of the engine, for example.

As shown in FIG. 1, a pair of flowmeter elements 10, 20 is disposed to a flow measurement part 30, and electrically connected to a controller 40. The controller 40 measures a mass flow rate of fluid by using signals output from the elements 10, 20. Specifically, a mass flowmeter includes the flowmeter elements 10, 20, the flow measurement part 30 and the controller 40, and the mass flow measurement system 100 includes the mass flowmeter and a power supply device (not shown), e.g., engine-controlling device, connected to the mass flowmeter.

The flow measurement part 30 corresponds to an air intake pipe of the engine-controlling device, and fluid, e.g., air, flows in the flow measurement part 30. The pair of the elements 10, 20 is mounted in the flow measurement part 30 to oppose to each other across a flow of fluid. That is, as shown in FIG. 1, the first flowmeter element 10 is disposed at an upstream side of the flow measurement part 30, and the second flowmeter element 20 is disposed at a downstream side of the flow measurement part 30 to oppose to the element 10. FIG. 1 shows a schematic cross-sectional view showing the flow measurement part 30 of the air intake pipe.

The flowmeter element 10, 20 has a membrane shape, and is constructed by a semiconductor board, an ultrasonic unit and a pressure detecting unit. The ultrasonic unit sends and receives ultrasonic wave, and the pressure detecting unit detects a pressure of fluid. The ultrasonic unit and the pressure detecting unit are integrally fitted to the semiconductor board. A side wall of the flow measurement part 30 has a hole, and the flowmeter element 10, 20 is arranged in the hole through a sealing member, for example. The flowmeter element 10, 20 will be described in details below.

The controller 40 is a microcomputer having a CPU 41, a memory 42 and the like. Electricity is supplied to the controller 40 from an outside device (not shown), e.g., engine-controlling device. The controller 40 performs a predetermined calculation based on a program stored in the memory 42, and outputs the calculation result into the engine-controlling device. Specifically, the CPU 41 of the controller 40 activates the ultrasonic unit of the flowmeter element 10, 20 to send or receive ultrasonic wave. Further, the controller 40 detects the pressure of fluid based on a signal output from the pressure detecting unit of the flowmeter element 10, 20.

Further, the CPU 41 of the controller 40 calculates a transmission time taken for transmitting ultrasonic wave between the elements 10, 20, and calculates a volume flow rate of fluid based on the calculated transmission time. Furthermore, the controller 40 calculates a mass flow rate of fluid based on the calculated volume flow rate and the pressure of fluid, and diagnoses the element 10, 20 to normally operate or not.

The memory 42 of the controller 40 is used for the diagnosis of the element 10, 20. A voltage is applied to a piezoelectric membrane 8 disposed between electrodes 9a, 9b shown in FIG. 2B, and an output signal is output from a strain gauge 6 shown in FIG. 2B when the voltage is applied. The voltage and the output signal are linked with each other, and stored in the memory 42 as a diagnosis map.

Here, the flowmeter element 10 will be described in details with reference to FIGS. 2A and 2B. The flowmeter element 20 has approximately the same structure as the flowmeter element 10, so that description of the flowmeter element 20 will be omitted.

Figure 2A:
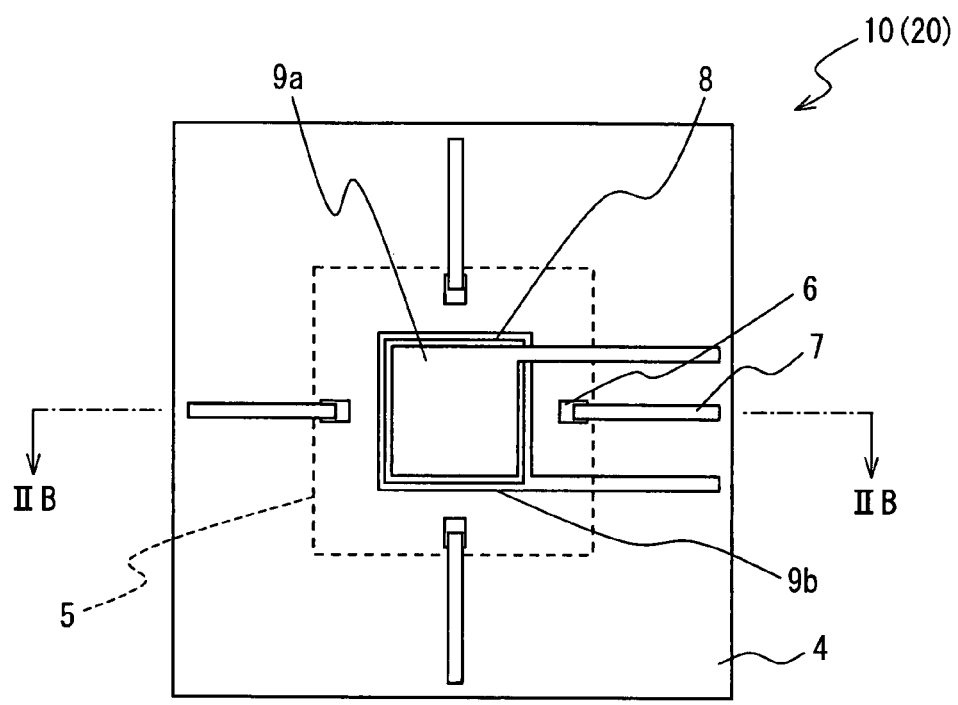
FIG. 2A is a schematic plan view showing a flowmeter element according to the embodiment.
Figure 2B:
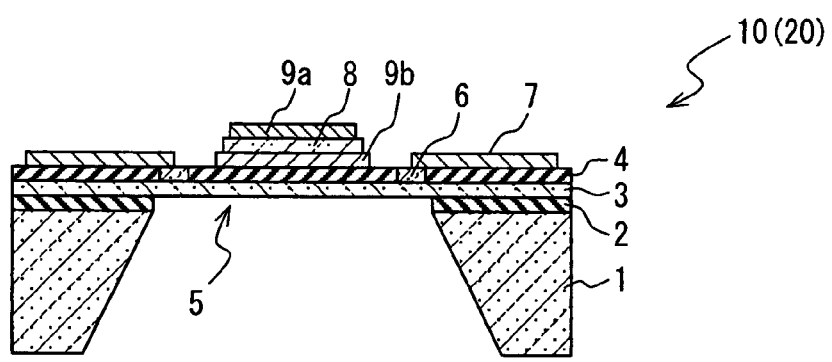
FIG. 2B is a schematic cross-sectional view showing the flowmeter element taken along line IIB-IIB in FIG. 2A.

As shown in FIGS. 2A and 2B, the flowmeter element 10 is constructed by a semiconductor board having a silicon on insulator (SOI) structure. The semiconductor board includes a first semiconductor layer 1 made of Si, an embedded oxide film 2 made of $SiO_2$, a second semiconductor layer 3 made of Si, and a protection oxide film 4 made of $SiO_2$. The semiconductor board has a membrane part 5, which is thinly formed by a micro electro mechanical technology. The ultrasonic unit and the pressure detecting unit are integrally formed on the membrane part 5. The ultrasonic unit has a sandwich structure, in which the piezoelectric membrane 8 made of a piezoelectric material is disposed between the electrodes 9a, 9b. The pressure detecting unit includes the strain gauge 6 and an electrode 7 connected to the strain gauge 6. The piezoelectric membrane 8 is thinly formed by a sol-gel method or sputtering.

That is, the ultrasonic unit and the pressure detecting unit are disposed on the same membrane part 5, so that a single semiconductor element, i.e., element 10, 20, can perform two functions, i.e., send/receive ultrasonic wave and detect pressure. Thereby, a size of the element 10 can be made smaller, and a mounting space for mounting the element 10 to the flow measurement part 30 can be reduced. Further, the ultrasonic unit and the pressure detecting unit are integrally disposed on the semiconductor board in order to construct the element 10. Thereby, the ultrasonic unit and the pressure detecting unit can be produced in the same semiconductor process, so that a production cost for producing the element 10, and a material cost of the element 10 can be reduced.

The piezoelectric material constructing the ultrasonic unit is not limited to the piezoelectric membrane 8. For example, a bulk piezoelectric material may be used in place of the piezoelectric membrane 8. In this case, ultrasonic wave sent by the element 10 can have a relatively high sound pressure, so that sensitivity can be improved. The piezoelectric material may be made of lead zirconate titanate (PZT), lanthanum-doped lead zirconate titanate (PLZT), niobium-doped lead zirconate titanate ((PZT)Nb), ZnO or AlN.

The CPU 41 of the controller 40 applies alternating voltage to the electrodes 9a, 9b in order to send ultrasonic wave from the element 10. Thereby, the membrane part 5 resonates with the electrodes 9a, 9b and the piezoelectric membrane 8 to have a predetermined ultrasonic-wave band frequency. Further, due to ultrasonic wave sent from the element 20, the membrane part 5 resonates with the piezoelectric membrane 8 and the electrodes 9a, 9b in order to receive the ultrasonic wave. The CPU 41 of the controller 40 makes the piezoelectric membrane 8 and the electrodes 9a, 9b to transform the received ultrasonic wave into an electrical signal.

In contrast, the membrane part 5 of the element 10 is distorted by pressure of fluid, and an amount of the distortion is defined by a resistance variation of the strain gauge 6. Thus, the CPU 41 of the controller 40 detects the pressure of fluid.

Next, operation of the mass flow measurement system 100 will be described. First, a self-diagnosis performed by the system 100 will be described. When electricity is supplied to the controller 40 from the engine-controlling device, the CPU 41 of the controller 40 supplies electricity to the piezoelectric membrane 8 (electrodes 9a, 9b) to make the membrane part 5 distorted together with the piezoelectric membrane 8 and the electrodes 9a, 9b. Then, the CPU 41 of the controller 40 detects an output signal output from the strain gauge 6 at the distortion time. The voltage applied to the piezoelectric membrane 8 (electrodes 9a, 9b) and the output signal output from the strain gauge 6 are compared with the diagnosis map stored in the memory 42 by the CPU 41 of the controller 40. Thus, the controller 40 diagnoses the element 10, 20 to normally operate or not. When the controller 40 determines the element 10, 20 to normally operate, the controller 40 starts measuring a mass flow rate of fluid as described below. In contrast, when the controller 40 determines the element 10, 20 to abnormally operate, the controller 40 indicates that the element 10, 20 is abnormal through an alarm device (not shown).

A timing of the self-diagnosis performed by the CPU 41 of the controller 40 is not limited to the timing of starting supplying electricity from the engine-controlling device. While electricity is supplied from the engine-controlling device, the self-diagnosis is performed every predetermined period, because the abnormality of the element 10, 20 can be always happened. Thus, reliability can be more improved.

Next, measurement of mass flow rate by the mass flow measurement system 100 will be described. As shown in FIG. 1, a distance L is defined between an approximately center part of the element 10 and an approximately center part of the element 20. An angle θ is defined between a line connecting the elements 10, 20 and a wall of the flow measurement part 30 extending from the element 10 toward a downstream side of the element 10. Fluid has the velocity of sound C in a windless state, and has a velocity V in the flow measurement part 30.

The CPU 41 of the controller 40 activates the element 10 disposed at the upstream side of the flow measurement part 30 to send ultrasonic wave. Ultrasonic wave sent from the element 10 is obliquely transmitted to the element 20 across the flow measurement part 30. The controller 40 controls the element 20 disposed at the downstream side of the flow measurement part 30 to receive ultrasonic wave sent from the element 10. The controller 40 measures a first transmission time $t1=L/(C+V \cos \theta)$. The first transmission time starts when ultrasonic wave is sent from the element 10, and ends when the sent ultrasonic wave is received by the element 20.

Then, the CPU 41 of the controller 40 activates the element 20 disposed at the downstream side of the flow measurement part 30 to send ultrasonic wave. Ultrasonic wave sent from the element 20 is obliquely transmitted to the element 10 across the flow measurement part 30. The controller 40 controls the element 10 disposed at the upstream side of the flow measurement part 30 to receive ultrasonic wave sent from the element 20. The controller 40 measures a second transmission time $t2=L/(C-V \cos \theta)$. The second transmission time starts when ultrasonic wave is sent from the element 20, and ends when the sent ultrasonic wave is received by the element 10.

The velocity of sound C is eliminated from the above two equalities, and the controller 40 calculates the velocity $V=L \cdot (1/t1-1/t2)/(2 \cos\theta)$. Because the distance L and the angle θ are known, when the flow measurement part 30 has a cross-sectional area S, the controller 40 can calculate a volume flow rate $Q=SV$.

Figure 3:
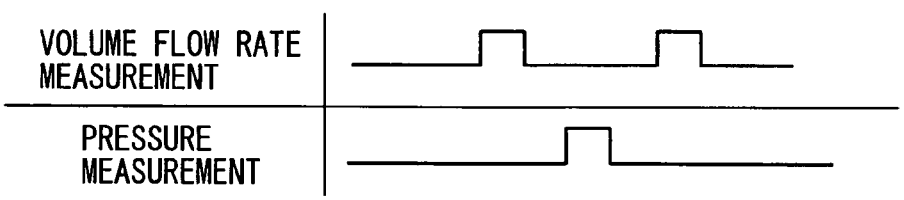
FIG. 3 is a time chart showing a timing of a volume flow rate measurement and a timing of a pressure measurement.

Further, the controller 40 detects (measures) a pressure P of fluid through the pressure detecting unit. Because the element 10 integrally includes the ultrasonic unit and the pressure detecting unit, a signal output from the ultrasonic unit and a signal output from the pressure detecting unit are required to be distinguished from each other. Therefore, a timing for measuring the pressure P may be made different from a timing for measuring the volume flow rate, i.e., timing for sending and receiving ultrasonic wave, as shown in FIG. 3.

Then, the controller 40 calculates a mass flow rate $Qm=QP$ by using the volume flow rate Q and the pressure P detected by the pressure detecting unit of the element 10, 20. Thus, the mass flow measurement system 100 can measure the mass flow rate of fluid. Further, the controller 40 outputs the calculated mass flow rate of fluid into the engine-controlling device.

According to the embodiment, the flowmeter element 10, 20 integrally includes the ultrasonic unit and the pressure detecting unit. The transmission time needed for transmitting ultrasonic wave, the volume flow rate and the mass flow rate are calculated by using the elements 10, 20. Therefore, the mass flow rate can be calculated without increasing the mounting space for mounting the element 10, 20 to the flow measurement part 30.

(First Modification)

As a first modification, a sending element for sending ultrasonic wave may be separably provided in a mass flowmeter. The other parts in the first modification may be made similar to the above embodiment.

Figure 4:
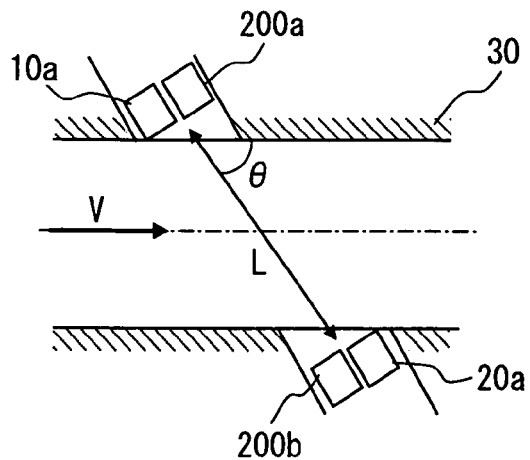
FIG. 4 is a schematic diagram showing a mass flow measurement system according to a first modification of the present invention.

As shown in FIG. 4, the mass flowmeter includes a first flowmeter element 10a, a second flowmeter element 20a, a first sending element 200a and a second sending element 200b. The flowmeter element 10a, 20a includes a semiconductor board having a membrane structure, and a piezoelectric membrane and a strain gauge are arranged on the membrane structure. The flowmeter element 10a, 20a receives ultrasonic wave and detects pressure of fluid. The sending element 200a, 200b includes a bulk piezoelectric material, and sends ultrasonic wave. A flat area of the bulk piezoelectric material of the sending element 200a, 200b is larger than that of the piezoelectric membrane of the flowmeter element 10a, 20a.

According to the first modification, the mass flowmeter includes the sending elements 200a, 200b having the bulk piezoelectric material in addition to the flowmeter elements 10a, 20a. The flowmeter element 20a receives ultrasonic wave sent from the sending element 200a, and the flowmeter element 10a receives ultrasonic wave sent from the sending element 200b.

Generally, sensitivity can be improved when a sending element outputs ultrasonic wave having a relatively high sound pressure. Therefore, according to the first modification, sensitivity can be improved, because the sending elements 200a, 200b are separably provided. Further, if sensitivity is kept approximately the same level, the mounting space can be reduced, compared with a case in which an ultrasonic wave sending element, an ultrasonic wave receiving element and a pressure detecting element are separately provided in a mass flowmeter.

(Second Modification)

Figure 5A:
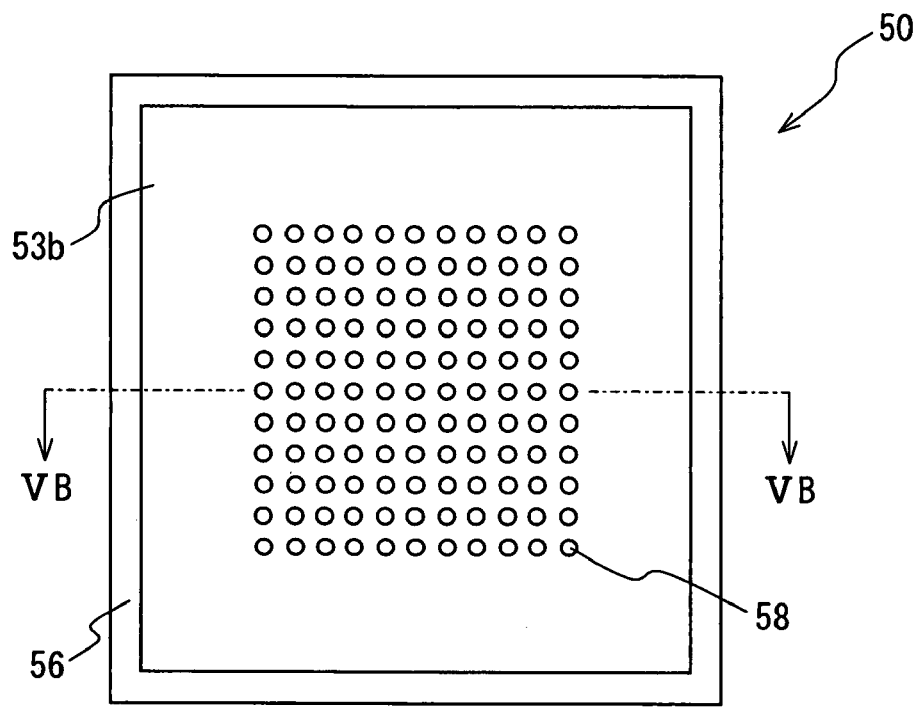
FIG. 5A is a schematic plan view showing a flowmeter element according to a second modification of the present invention.
Figure 5B:
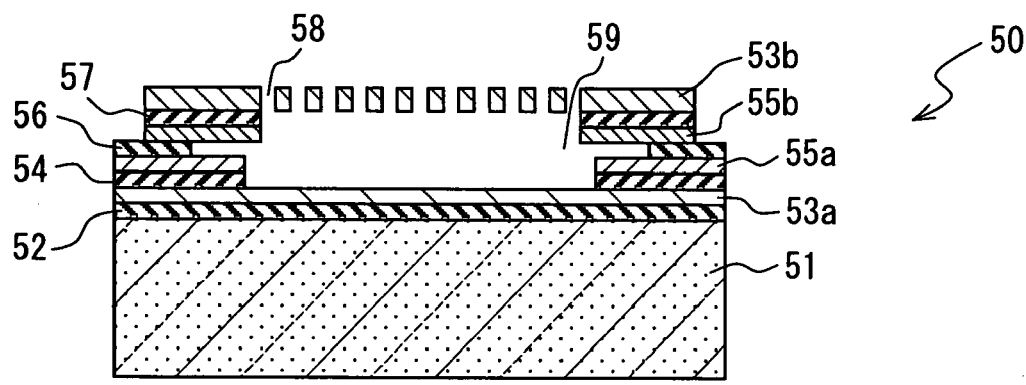
FIG. 5B is a schematic cross-sectional view showing the flowmeter element taken along line VB-VB in FIG. 5A.

As a second modification, a capacitive flowmeter element 50 shown in FIGS. 5A and 5B may be used in place of the flowmeter element 10, 20 having the membrane part 5. The other parts in the second modification may be made similar to the above description.

As shown in FIGS. 5A and 5B, the capacitive flowmeter element 50 includes a first electrode 53a and a second electrode 53b used for detecting a capacitance therebetween. The first electrode 53a is arranged on a semiconductor board 51 through an insulation film 52. The second electrode 53b is spaced from the first electrode 53a to oppose to the first electrode 53a through air gap 59. A part of the second electrode 53b opposing to the air gap 59 has an air hole 58.

An insulation film 54, a first air gap controlling electrode 55a, an insulation film 56, a second air gap controlling electrode 55b and an insulation film 57, each of which has a through hole to form the air gap 59, are arranged in this order between the electrodes 53a, 53b.

The semiconductor board 51 is made of Si, for example. The first electrode 53a, the second electrode 53b, the first air gap controlling electrode 55a and the second air gap controlling electrode 55b are made of a conductive material, e.g., polysilicon, aluminum or gold. The insulation films 52, 54, 56, 57 are made of $SiO_2$, for example.

When a voltage is applied to the electrodes 53a, 53b of the capacitive flowmeter element 50, the electrode 53b is distorted. Thereby, the air gap 59 is varied, so that ultrasonic wave is sent from the element 50. Further, when ultrasonic wave is received by the element 50, or when a pressure is applied to the element 50 by fluid, the electrode 53b is distorted. Thereby, the air gap 59 between the electrodes 53a, 53b is varied. Thus, the capacitance between the electrodes 53a, 53b is varied, and the varied capacitance is output as an output signal.

According to the second modification, an ultrasonic unit for sending and receiving ultrasonic wave, and a pressure detecting unit for detecting pressure of fluid can be integrally disposed on the semiconductor board 51, so that the mounting space can be reduced.

Here, a self-diagnosis performed by the capacitive flowmeter element 50 will be described. When electricity is supplied to the controller 40 from the engine-controlling device, the CPU 41 of the controller 40 supplies electricity to the electrodes 55a, 55b to vary the air gap 59 between the electrodes 53a, 53b. At this time, the controller 40 detects the capacitance between the electrodes 53a, 53b.

The voltage applied to the electrodes 55a, 55b and the capacitance are compared with the diagnosis map stored in the memory 42 by the controller 40, in order to determine the element 50 to normally operate or not. The voltage and the capacitance are linked with each other in advance as the diagnosis map, and the diagnosis map is stored in the memory 42.

When the controller 40 determines the element 50 to normally operate, the controller 40 starts measuring a mass flow rate of fluid. In contrast, when the controller 40 determines the element 50 to abnormally operate, the controller 40 indicates that the element 50 is abnormal through an alarm device (not shown).

A timing of the self-diagnosis performed by the controller 40 is not limited to the timing of starting supplying electricity from the engine-controlling device. While electricity is supplied from the engine-controlling device, the self-diagnosis is performed every predetermined period, because the abnormality of the element 50 can be always happened. Thus, reliability can be more improved.

In addition, because a sound pressure of ultrasonic wave sent by the capacitive flowmeter element 50 is relatively low, the element 50 is mainly used for receiving ultrasonic wave and detecting pressure of fluid, and an ultrasonic wave sending element may be separably provided. That is, the capacitive flowmeter element 50 may be used as the flowmeter element 10a, 20a of the first modification, and the sending element 200a, 200b of the first modification may be used as the ultrasonic wave sending element in this case.

(Third Modification)

In the above embodiment, the timing for measuring the pressure is made different from the timing for measuring the volume flow rate, because the ultrasonic unit and the pressure detecting unit are integrated in the flowmeter element 10, 20, as shown in FIG. 3. As a third modification, the measuring of the volume flow rate, i.e., sending and receiving of ultrasonic wave, and the measuring of the pressure of fluid may be performed at approximately the same time. The other parts in the third modification may be made similar to the above description.

The measuring of the volume flow rate and the measuring of the pressure of fluid can be performed at approximately the same time, because frequency for sending and receiving ultrasonic wave is generally known.

Figure 6A:
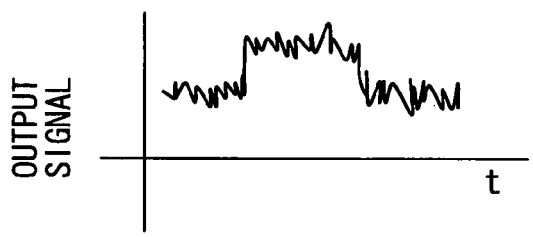
FIG. 6A is a time chart showing an output by a flowmeter element according to a third modification of the present invention.
Figure 6B:
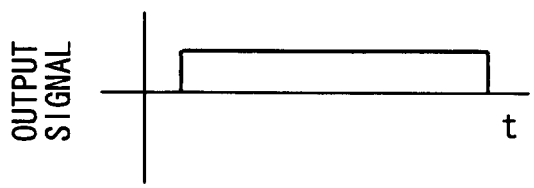
FIG. 6B is a time chart showing an output by a pressure detecting unit of the flowmeter element.
Figure 6C:
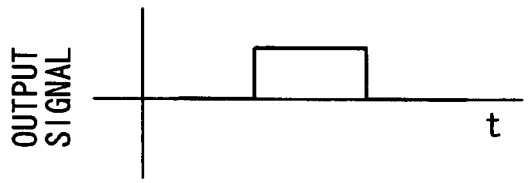
FIG. 6C is a time chart showing an output by an ultrasonic unit of the flowmeter element.

As shown in FIG. 6A, a signal output from the pressure detecting unit and a signal output from the ultrasonic unit overlaps with each other, when the measuring of the volume flow rate and the measuring of the pressure of fluid are performed at approximately the same time. The CPU 41 of the controller 40 performs frequency separation, so that the overlap signal is separated into a signal by the pressure detecting unit shown in FIG. 6B and a signal by the ultrasonic unit shown in FIG. 6C. Thereby, responsivity can be improved, so that time needed for measuring the mass flow rate by the mass flowmeter and the mass flow measurement system can be reduced.

(Fourth Modification)

Figure 7A:
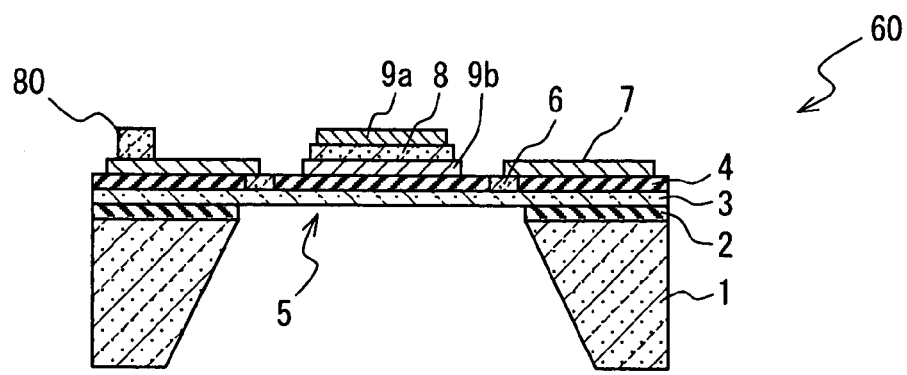
FIG. 7A is a schematic cross-sectional view showing a membrane type flowmeter element according to a fourth modification of the present invention.
Figure 7B:
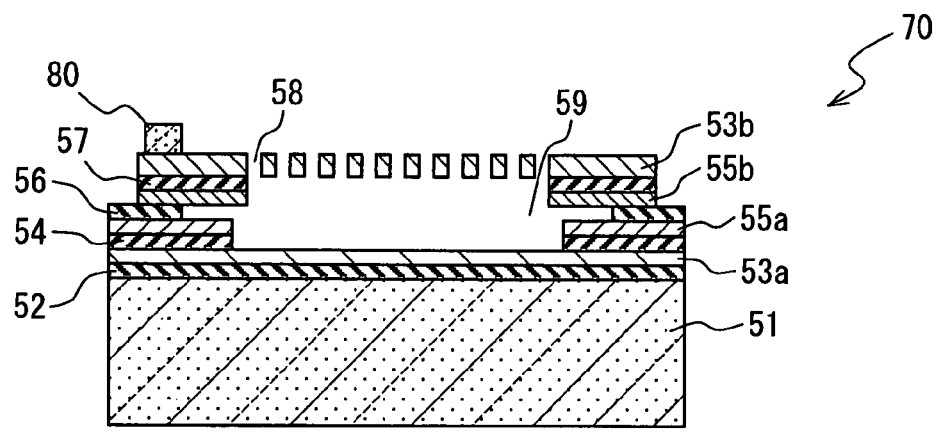
FIG. 7B is a schematic cross-sectional view showing a capacitive flowmeter element according to the fourth modification of the present invention.

As a fourth modification, a temperature sensor 80 for detecting temperature of fluid is disposed in a membrane type flowmeter element 60 shown in FIG. 7A or a capacitive flowmeter element 70 shown in FIG. 7B. Temperature correction can be performed relative to the velocity for transmitting ultrasonic wave and the pressure of fluid based on detection result detected by the temperature sensor 80. The other parts in the fourth modification may be made similar to the above description.

A volume of fluid is varied by a temperature of the fluid. Therefore, the velocity for transmitting ultrasonic wave and the pressure applied to the pressure detecting unit are varied by the temperature of the fluid.

As shown in FIG. 7A, the temperature sensor 80 is mounted to the membrane type flowmeter element 60. As shown in FIG. 7B, the temperature sensor 80 is mounted to the capacitive flowmeter element 70. Further, the velocity for transmitting ultrasonic wave or the pressure of fluid is linked with temperature, and the linked relationship is stored in the memory 42 in advance as a temperature map, for example. The CPU 41 of the controller 40 performs temperature correction relative to the velocity and the pressure using detection result detected by the temperature sensor 80 and the temperature map.

Thereby, the mass flow rate of fluid can be accurately calculated, so that reliability of the mass flowmeter and the mass flow measurement system 100 can be improved. Further, because the temperature sensor 80 is integrated with the flowmeter element 60, 70, the mounting space can be kept small.

(Other Modification)

In the above embodiment and modifications, the flowmeter element is constructed by the ultrasonic unit and the pressure detecting unit, which are integrated with the semiconductor board. Alternatively, the flowmeter element may be constructed by a single bulk piezoelectric material, which can function as both of the ultrasonic unit and the pressure detecting unit.

Such changes and modifications are to be understood as being within the scope of the present invention as defined by the appended claims.

What is claimed is:

1. A flowmeter element used for measuring a mass flow rate of fluid, the flowmeter element comprising:
    a semiconductor board;
    an ultrasonic unit for performing at least one of sending ultrasonic wave and receiving ultrasonic wave; and
    a pressure detecting unit for detecting a pressure of the fluid, wherein
        the ultrasonic unit and the pressure detecting unit are integrally disposed on the semiconductor board,
        the ultrasonic unit has a piezoelectric member,
        the pressure detecting unit has a strain gauge,
        the semiconductor board has a membrane structure, and
        the piezoelectric member and the strain gauge are disposed on the membrane structure.

2. The flowmeter element according claim 1, wherein
    the piezoelectric member has a membrane shape or a bulk shape.

3. The flowmeter element according to claim 1, wherein the piezoelectric member is made of lead zirconate titatnate (PZT), lanthanum-doped lead zirconate titanate (PLZT), niobium-doped lead zirconate titanate ((PZT)Nb), ZnO or AlN.

4. The flowmeter element according to claim 1, wherein the ultrasonic unit and the pressure detecting unit includes a first electrode and a second electrode, the first electrode is disposed on the semiconductor board, the second electrode is spaced from the first electrode to oppose to the first electrode, and has an air hole at a part of the second electrode opposing to the first electrode, the first electrode and the second electrode has therebetween a clearance, which is varied when the ultrasonic unit receives ultrasonic wave or when the pressure detecting unit detects the pressure, and the first electrode and the second electrode has therebetween a capacitance, which is varied by the variation of the clearance and output as an output signal.

5. A mass flowmeter comprising:

a pair of flowmeter elements, each of the pair of flowmeter elements integrally including an ultrasonic unit and a pressure detecting unit;

a flow measurement part, through which fluid flows, and wherein one of the pair of flowmeter elements is disposed at an upstream side of the fluid and the other of the pair of flowmeter elements is disposed at a downstream side of the fluid, such that the pair of flowmeter elements oppose to each other;

a volume flow rate calculator for calculating a transmission time needed for transmitting ultrasonic wave between the pair of flowmeter elements, and calculating a volume flow rate of the fluid based on the calculated transmission time; and a mass flow rate calculator for calculating a mass flow rate of the fluid based on the calculated volume flow rate and a pressure value of the fluid in the flow measurement part detected by the pressure detecting unit.

6. The mass flowmeter according to claim 5, further comprising:

a pair of sending elements for sending ultrasonic wave, each of the pair of sending elements having a bulk piezoelectric member and wherein one of the pair of sending elements is disposed at the up stream side of the fluid and the other of the pair of sending elements is disposed at the downstream side of the fluid, such that the pair of sending elements oppose to each other, wherein the ultrasonic unit of each of the pair of flowmeter elements receives ultrasonic wave sent from the sending element across the flow measurement part, and the volume flow rate calculator calculates the transmission time by using ultrasonic wave, which is sent by one of the pair of sending elements and received by the ultrasonic unit of the flowmeter element across the flow measurement part.

7. The mass flowmeter according to claim 5, further comprising:

a temperature sensor for detecting a temperature of the fluid; and temperature correction calculator for performing a temperature correction relative to a velocity for transmitting ultrasonic wave and the pressure value of the fluid based on a detection result detected by the temperature sensor.

8. The mass flowmeter according to claim 7, wherein the temperature sensor is integrated with at least one of the pair of flowmeter elements.

9. The mass flowmeter according to claim 5, wherein the pressure detecting unit of each of the pair of flowmeter elements has a first timing for detecting the pressure of the fluid, the ultrasonic unit of each of the pair of flowmeter elements has a second timing for sending and receiving ultrasonic wave, and the first timing is different from the second timing.

10. The mass flowmeter according to claim 5, further comprising:

a frequency separator for separating a frequency of a signal output from the pressure detecting unit and a frequency of a signal output from the ultrasonic unit of one of the pair of flowmeter elements, wherein the pressure detecting unit of the one of the pair of flowmeter elements detects the pressure of the fluid at a first timing, and the ultrasonic units of the pair of flowmeter elements send and receive ultrasonic wave at a second timing, which is approximately the same as the first timing.

11. The mass flowmeter according to claim 5, wherein for each of the pair of the flowmeter elements, the flowmeter element includes a semiconductor board, and the ultrasonic unit and the pressure detecting unit are integrally arranged on the semiconductor board.

12. The mass flowmeter according to claim 11, wherein for each of the pair of the flowmeter elements, the ultrasonic unit has a piezoelectric member the pressure detecting unit has a strain gauge, the semiconductor board has a membrane structure, and the piezoelectric member and the strain gauge are disposed on the membrane structure.

13. The mass flowmeter according to claim 12, wherein for each of the pair of the flowmeter elements, the piezoelectric member has a membrane shape or a bulk shape.

14. The mass flowmeter according to claim 12, wherein for each of the pair of the flowmeter elements, the piezoelectric member is made of lead zirconate titatnate (PZT), lanthanum-doped lead zirconate titanate (PLZT), niobium-doped lead zirconate titanate ((PZT)Nb), ZnO or AlN.

15. The mass flowmeter according to claim 12, further comprising:

a first diagnosis memory, in which a voltage applied to the piezoelectric member of one of the pair of flowmeter elements and a resulting signal output from the strain gauge of the one of the pair of flowmeter elements are linked with each other and the linked relationship is stored; and a first diagnosis element for controlling the supply of electricity to the piezoelectric member to make the membrane structure to be displaced, wherein the first diagnosis element compares the voltage and the signal with the linked relationship stored in the first diagnosis memory and diagnoses the flowmeter element to normally operate or not.

16. A mass flow measurement system including the mass flowmeter according to claim 15, further comprising:

a power device for supplying electricity to activate the mass flowmeter, wherein the first diagnosis element of the mass flowmeter performs the diagnosis when the power device supplies electricity to the mass flowmeter.

17. The mass flow measurement system according to claim 16, wherein
the first diagnosis element performs the diagnosis every predetermined period while the power device supplies electricity to the mass flowmeter.

18. The mass flowmeter according to claim 11, wherein
the ultrasonic unit and the pressure detecting unit includes a first electrode and a second electrode,
the first electrode is disposed on the semiconductor board,
the second electrode is spaced from the first electrode to oppose to the first electrode, and has an air hole at a part of the second electrode opposing to the first electrode,
the first electrode and the second electrode has therebetween a clearance, which is varied when the ultrasonic unit receives ultrasonic wave or when the pressure detecting unit detects the pressure, and
the first electrode and the second electrode has therebetween a capacitance, which is varied by the variation of the clearance and output as an output signal.

19. The mass flowmeter according to claim 18, further comprising:
a diagnosis electrode for changing the clearance between the first and second electrodes when electricity is supplied thereto;
a second diagnosis memory, in which a voltage applied to the diagnosis electrode and a signal representing the capacitance between the first and second electrodes are linked with each other and the linked relationship is stored; and
a second diagnosis element for controlling to supply electricity to the diagnosis electrode to change the clearance between the first and second electrodes, wherein
the second diagnosis element compares the voltage and the signal with the linked relationship stored in the second diagnosis memory to diagnose the flowmeter element to normally operate or not.

20. A mass flow measurement system including the mass flowmeter according to claim 19, further comprising: a power device for supplying electricity to activate the mass flowmeter, wherein the second diagnosis element of the mass flowmeter performs the diagnosis when the power device supplies electricity to the mass flowmeter.

21. The mass flow measurement system according to claim 20, wherein the second diagnosis element performs the diagnosis every predetermined period while the power device supplies electricity to the mass flowmeter.

22. The mass flowmeter according to claim 5, wherein
at least one of the pair of flowmeter elements includes a single bulk piezoelectric member, and
the single bulk piezoelectric member operates as both of the ultrasonic unit and the pressure detecting unit.

* * * * *